United States Patent [19]

Kuster et al.

[11] Patent Number: 5,578,920

[45] Date of Patent: Nov. 26, 1996

[54] COMPENSATION OF INTERFERING FIELDS IN NMR MEASUREMENTS IN THE EARTH'S MAGNETIC FIELD

[75] Inventors: Anton Kuster, Greifensee, Switzerland; Dirk D. Laukien, Lexington, Mass.

[73] Assignee: Spectrospin AG, Switzerland

[21] Appl. No.: 499,830

[22] Filed: Jul. 10, 1995

[30] Foreign Application Priority Data

Jul. 14, 1994 [DE] Germany ..................... 44 24 842.3

[51] Int. Cl.[6] .............................................. G01V 3/00
[52] U.S. Cl. .............................................. 324/301
[58] Field of Search .................... 324/300, 303, 324/307, 309, 318, 322, 301

[56] References Cited

U.S. PATENT DOCUMENTS

| 3,019,383 | 1/1962 | Varian . | |
|---|---|---|---|
| 3,441,838 | 4/1969 | Salvi et al. . | |
| 3,538,429 | 11/1970 | Baker, Jr. . | |
| 4,665,368 | 5/1987 | Sugiyama et al. | 324/318 |
| 5,463,318 | 10/1995 | Duret | 324/303 |

FOREIGN PATENT DOCUMENTS

| 0512345 | 11/1992 | European Pat. Off. | ......... G01V 3/14 |
|---|---|---|---|
| 3690746 | 6/1988 | Germany | ......... G01V 3/14 |
| 2198540 | 6/1988 | United Kingdom | ......... G01V 3/14 |

OTHER PUBLICATIONS

Elektrotechnische Zeitschrift, ETZ-B, Bd. 17, 1965 pp. 149–152.

Primary Examiner—Louis M. Arana
Attorney, Agent, or Firm—Walter A. Hackler

[57] ABSTRACT

In an apparatus having at least one detection coil (1) for the detection of nuclear magnetic resonance (NMR) from a sensitivity region of the detection coil (1) in the ground, whereby nuclear spins within the sensitivity region are excited by repeated coherent excitation, in each case, to precess in the earth's field and produce a small NMR induction voltage in the detection coil (1) which is introduced to a first amplifier (7), the detection coil (1) consists of at least two oppositely wound partial coils (2, 3) having parallel coil axes which are connected electrically in series and at least one compensation coil (8, 9, 10) is provided for additional compensation of spatially inhomogeneous interfering fields whose induction signal is introduced to a second amplifier (18, 19, 20) having adjustable amplification. In this fashion, in addition to the homogeneous portion, an inhomogeneous portion due to distant disturbances can be eliminated from the measured signal.

18 Claims, 5 Drawing Sheets

5,578,920

COMPENSATION OF INTERFERING FIELDS IN NMR MEASUREMENTS IN THE EARTH'S MAGNETIC FIELD

BACKGROUND OF THE INVENTION

The invention concerns a measuring device having at least one detection coil for the detection of nuclear magnetic resonance (NMR) from a sensitivity region of the detection coil within the earth, whereby nuclear spins within the sensitivity region are, in each case, excited to precess in the earth's field through repeated coherent excitation to produce a small NMR induction voltage in the detection coil which is introduced to a first amplifier.

A coil system of this kind is known in the art, for example, from DE 36 90 746C2. In this publication one attempts to extract spatially resolved information from the earth using NMR measurements. Towards this end a coil is placed on the earth's surface to produce an alternating field for the excitation of magnetic resonance in the earth's magnetic field. Subsequently, the resonance signal due to the free precession of the nuclear spins in the earth is measured using this coil.

The spatially resolved extraction of NMR signals from the earth is, in addition, known in the art from EP 0 512 345 A1, whereby, using surface coils, a main magnetic field, magnetic gradient fields, as well as a high frequency field for the excitation of the NMR signals are produced.

The elimination of interferences occurring during the recording of NMR signals in a configuration similar to that of DE 36 90 746 C2is known in the art from U.S. Pat. No. 3,019,383, wherein following each excitation, one records, using two receiving channels which are stored to magnetic tape, the interference together with the usable signal in one channel, and, following a waiting time, the interference only in the other channel. Both channels are simultaneously read-out and effectively subtracted. One collects data over a plurality of excitations to thereby suppress highly distorted signals.

The origin of NMR signals is usually moisture in the earth. The signals are extremely small so that, for a single excitation, they are buried in the noise of the measuring configuration. In a typical environment which can also be outside of a residential area, the received signal is nevertheless dominated by interferences which are generally associated with (but are not completely due to) the power line frequency of 50 Hz or the railway frequency of 16 ⅔ Hz and their higher harmonics. Since there is no fixed phase relationship between the NMR excitation and the interfering signals, the interferences as well as the noise should be slowly averaged-out through accumulation of a large number of signals. For interferences which do not change within the framework of the repetition time of the excitation it is possible to utilize a subtraction procedure as in the above-mentioned U.S. Pat. No. 3,019,383. Towards this end, however, there is a dynamic range problem, since the largest interfering signal limits the maximum amplification.

However, it has been surprisingly demonstrated in field trials that although spatially homogeneous disturbances constitute the largest fraction of the interfering signals, a sizable portion is nevertheless due to inhomogeneous local interferences which are largely in the frequency range of the power lines or the railway frequency and their upper harmonics without being proximate to underground power lines or elevated power lines which could have explained same. The magnetic field lines of this interfering portion are not parallel and equidistant over the area of the measuring coil configuration but rather are diagonal thereto and the field strength has a spatial dependence.

Since the NMR measuring coil configuration is normally horizontally located on the ground, it can only detect signal components whose magnetic field vector is perpendicular to the earth's surface (z-direction). The inhomogeneous interfering fields, however, change from one partial detection coil to another with respect to their field strength as well as as their direction and are therefore not compensated for or not fully compensated for using a configuration having at least two coils which, in particular, are located in a common plane.

It it therefore the purpose of the present invention to improve a coil system of the above-mentioned kind in such a fashion that the interfering signals which occur are more satisfactorily eliminated.

SUMMARY OF THE INVENTION

This purpose is achieved in accordance with the invention in that the detection coil is fashioned from at least two partial coils having parallel coil axes which are wound in opposite directions and connected electrically in series or parallel and in that at least one compensation coil is provided for an additional compensation of spatially inhomogeneous interfering fields whose induction signal is introduced to a second amplifier having adjustable gain.

With this configuration external distant interferences are almost completely eliminated. The simplest embodiment is a detection coil which is placed on the ground in the shape of a figure eight. The two partial areas of the figure eight are of equal size and the winding numbers are equal but oppositely directed. In the event that the coil conductors are flexible, a fine adjustment can be effected by a slight displacement of the conductor position in order to minimize the interfering signal.

The winding numbers, shape and area of the partial coils can be varied as long as the entire distant interference induction signal is minimized. By connecting the two partial coils before the first preamplification stage, the distant interferences can be compensated at an earlier stage even before initial amplification to significantly reduce dynamic range problems. The first amplification stage can operate at significantly larger gains without saturating.

In an improved embodiment of the invention, preferentially at least two additional compensation coils are provided for the additional compensation of spatially inhomogeneous interfering fields whose induction signals are overlapped with those of the detection coil in individually attenuated fashion to form a total signal. In this fashion each arbitrarily oriented vector signal can be completely received and reconstructed.

An embodiment is particularly preferred with which the compensation coils are three mutually orthogonally arranged coils. The reconstruction of the vector signal recorded thereby is particularly simple in this embodiment.

In an embodiment a plurality of identical systems each having three compensation coils are provided for which are arranged at different locations. In this fashion the inhomogeneous interferences of a plurality of differing interfering sources can be more effectively compensated.

In a further embodiment of the measuring device in accordance with the invention, the spatial positioning, the winding numbers, the cross-sectional areas and the permeabilities of the materials of the partial coils of the detection coil are chosen in such a fashion that a spatially homogeneous alternating interfering magnetic field, to a good approximation, does not cause an induction voltage in the detection coil, whereas an NMR signal which is small relative to the interfering signal and which emanates from the sensitivity region of the entire detection coil in the earth, is not compensated.

The line connecting the middle points of the partial coils of the detection coil is preferentially directed in an east-west direction. The excitation magnetic field $B_1$ produced is then largely perpendicular to the earth's magnetic field $B_0$ so that the excited signal can be maximally detected with the appropriately oriented detection coil.

An embodiment of the measuring device in accordance with the invention is particularly preferred with which at least one of the partial coils of the detection coil is arranged at a spatial separation from the earth's surface so that largely no NMR signal is detected thereby from flooring construction components lying below same. In this fashion one guarantees that the other partial coils define and largely solely receive the NMR signals from the sensitive measuring volume of the region of the earth to be investigated, whereas the partial coils arranged above the ground serve only for the compensation of distant interferences.

An improvement of this embodiment is advantageous with which the partial coil arranged at a separation from the earth's surface is small compared to the other partial coil of the detection coil placed on the earth's surface and exhibits an higher winding number. In this fashion the partial coil arranged at a distance from the earth's surface, which normally is mounted on a tripod or a suitable support frame, is particularly compact and easy to make so that the additional mechanical difficulties associated with its support are minimal.

An embodiment is preferred with which the partial coil arranged at a distance from the surface is arranged with its coil-plane largely parallel to the earth's surface. Since the detection coil partial coil (or coils) arranged on the ground are likewise largely parallel to the earth's surface, all detection coil partial coils substantially detect the same distant interference vector.

An improvement in this embodiment is particularly preferred with which the line of connection of the middle points of the partial coil arranged at a distance from the earth's surface and a partial coil located there below on the earth's surface is largely perpendicular to the earth's surface. In this fashion the sensitive measuring volume is almost exclusively defined by the partial coil placed on the ground, whereas the upper compact partial coil arranged above the middle of the ground coil solely receives the far-field portion of the interference and only an additional insignificant fraction of the near-field due to structures present in the ground.

An embodiment is advantageous with which the detection coil partial coil arranged at a distance from the earth's surface comprises a cooling system for cooling the coil. This is particularly easy to realize due to the compact configuration of the upper partial coil. By means of the cooling, the ohmic resistance and thereby the electrical noise of the upper partial coil, which functions as a far-field compensator, is substantially reduced.

The compensation coil, which is generally very small compared to the detection coil, must no longer be simply connected in series with the detection coil. Their induction signals can be individually attenuated (or amplified) in such a fashion that the overall signal from the detection coil and compensation coil (or coils) is minimized. This can be done electronically. In principle, however, a mechanical tuning is also conceivable, possibly by rotating the compensation coils, through displacement, or, for example, changes in the overlap between two oppositely directed partial compensation coils. In these cases the series connection to the main detection coil can be maintained which has the advantage that the compensation still occurs before the first amplification.

A variation is, however, preferred with which the compensation coils are connected-in following individually adjustable amplifiers so that the amplified or possibly digitized measuring signals from the detection coils and compensation coils are overlapped. The gains can be adjusted by hand or automatically in such a fashion that the entire signal is minimized. Towards this end the compensation coils are preferentially positioned in such a fashion that they maximally receive the interfering signal which is to be compensated in order to keep the noise contribution of the compensation branch small. The orientation thereby deviates in general from the z-direction due to the above-mentioned rotation of the field line direction. A possible explanation for this phenomenon could be that currents flow in the earth through the ground in conducting layers which could easily connect distant sources and sinks. These connecting paths are not direct rather are determined by the local composition of the earth, and largely by the water content.

The above-described compensation coil configuration therefore preferably comprises three largely identical partial compensation coils which are orthogonal to each other and whose contributions to the compensation signal can be individually adjusted. In this manner it is possible, after first setting-up the compensation coil configuration, to optimize the compensation using purely electronic means and to track an arbitrary rotation of the field line direction of the interfering field between the detection coil and the compensation coil.

The compensation coil configuration should be constructed and located in such a fashion that no or only a negligibly small NMR signal is induced.

This is apparently already a problem due to the splitting of the detection coil into two partial coils. Since, however, an NMR signal is excited only in the near-field region below the coil, the NMR signal is not a far-field signal which could be compensated for by this configuration. The detection region of a two-coil configuration, for example, in the shape of a flat figure eight, is different than that of an individual coil but nevertheless exists. The field lines are primarily perpendicular to the individual coil surfaces and directed upwardly or downwardly thereto. They close below the coil configuration in such a fashion that they travel largely parallel at large depths. The partial coils of the figure eight should be positioned, if possible, in such a fashion that the field lines intersect those of the earth's magnetic field at an angle which is close to 90°.

A method for measuring nuclear magnetic resonance in the earth with the assistance of a measuring device of the above-mentioned kind is also the subject of the invention and is characterized by repeated coherent excitation, in each case, of nuclear spins from a sensitivity region of the detection coil in the natural magnetic field of the earth for excitation into precession and for the production of a small NMR induction signal in the detection coil and the induction signal in the detection coil is overlapped with oppositely signed induction signals from the component coil or coils into a combined signal, whereby the combined signal of all excitations is accumulated.

The method can be distinguished in that the detection coil comprises at least two opposing partial coils whose orientations, winding numbers and cross-sectional areas are chosen in such a fashion and which are connected to the entire detecting coil in such a manner, that a spatially homogeneous magnetic alternating interfering field, to a good approximation, produces no induction voltage therein but that an NMR signal which is small compared to this interference signal and which comes from the sensitivity region of the entire detection coil in the earth, is not compensated for, and that, by means of an alternating field generator and a power amplifier, an alternating current pulse is sent through the detection coil which includes the magnetic resonance frequency region of a nuclear spin species, preferentially protons, within the earth's magnetic field and that, subsequently, the free induction signal of the detection coil is amplified, digitized and stored and that the excitation, amplification and digitalization steps are repeated a plurality of times, whereby the digitalized induction signal is accumulated in phase.

A variation of the method in accordance with the invention is particularly preferred with which the induction signal from the compensation coils or coils is amplified in such a fashion that the entire signal from the detection coil and compensation coil or coils is minimized. Since the dominant main portion of the signal received by the detection coil is due to interferences, whereas the actual usable NMR signal is "hidden" in the noise, through minimizing the overall detection coil and compensation coil signal, only largely "detrimental" signal portions are eliminated. The remaining substantially smaller signal portions are also still largely noise dominated, but the noise can be averaged-out by very long accumulations, whereas the "usable" signal portion due to nuclear magnetic resonance in the earth's magnetic field add coherently.

With a particularly simple embodiment of the invention, only one compensation coil is utilized whose signal is maximized by location and orientation of the compensation coil and subsequently the maximized signal from the compensation coil is subtracted from the detection coil signal prior to rectification, whereby a gain for the compensation coil signal is varied in such a fashion that the time integral over the rectified difference signal is minimized.

A variation of the method in accordance with the invention is particularly preferred with which a plurality of compensation coils are utilized whose entire induction signal is maximized by appropriate placing of the compensation coils in the vicinity of the detection coil. In this fashion the location of the largest local field interference is determined and the latter is eliminated from the measurement.

In an improvement in this variation of the method, the spatial orientation of the compensation coil is varied after its initial placing in such a fashion that the entire induction signal from the compensation coil is maximized. In this fashion the largest local inhomogeneous field interference is completely vectorially determined.

An improvement in this variation of the method is particularly simple with which, after maximizing the entire induction signal of the compensation coils, only one single compensation coil having the same placement is oriented in such a fashion that it detects the maximum possible interference signal at this location corresponding to the interfering vector field determined with the assistance of the plurality of compensations coils and that the signal from the individual compensation coil is subtracted from the signal from the detection coil, whereby, through variation of an amplification factor for the signal from the compensation coil, the time integral over the rectified difference signal is minimized. In this fashion only one single amplifier is necessary, as a result of which the cost of the measuring apparatus is reduced. The noise component in the measured signal is simultaneously reduced, since only the electronic noise from one single amplifier is overlapped with the signal from the compensation coil.

In an alternative variation of the method, the induction signal maximized by the location of the compensation coil is subtracted from the signal from the detection coil prior to rectification, whereby individual gains for each individual compensation coil are varied in such a fashion that the time integral over the rectified difference signal is minimized. A spatial orientation of the individual compensation coils is unnecessary, since alignment with the local interfering field vector takes place, so to speak, electronically.

An additional variation of the method is distinguished in that, subsequent to the location of the compensation coils, their overall induction signal is maximized by variation of individual gains for each individual compensation coil and, subsequently, the optimized signal from the compensation coils is subtracted from the detection coil signal, whereby the time integral over the rectified difference signal is minimized through variation of a common amplification factor for the entire compensation coil signal. In this manner it is only necessary to optimized one single gain.

Since the actual measured signal is always so small that it vanishes in the a noise for any individual measurement, in a variation, interferences can be further eliminated in that variation of the gain or gains is done with the assistance of a fitting procedure, in particular, with a linear prediction method or with a maximum entropy method. In this fashion it is possible to specifically eliminate transient interferences which are only significantly noticeable in one individual measurement.

The fitting of the spectrum using a linear prediction or the maximum entropy method is preferentially done in a suitable computer.

The accumulated digitized time signal from the detection coil and the compensation coil or coils can be Fourier-transformed either before or after the accumulation in order to obtain a frequency spectrum of the NMR signals from the investigated region of the earth. In particular, the Fourier-transformed signals are especially well-suited for extraction of an NMR image of the region being investigated.

The above described variations of the method in accordance with the invention can also be advantageously combined with the methods for obtaining position resolution disclosed in DE 36 90 746 C2 or EP 0 512 345 A1.

By appropriate weighting of the induction signals delivered by the compensation coils it is also possible to achieve a broad-band phase compensation with alternating interfering fields. Furthermore, the "timing" and the phases of the excitation pulses can be chosen in such a fashion that coherent interferences are temporarily averaged-out over a plurality of excitations while specifically avoiding the signal phase so that the signals are properly accumulated in phase. These types of phase rotation of the excitation pluses are, for example, known from the methods PAPS, CYCLOPS or from the procedure for pseudo-statistical phase changes per se. The phase changes can be anticorrelated with the fundamental interfering frequencies or their harmonics (50 Hz, 16⅔ Hz, etc.) by triggering at the appropriate frequency.

Further advantages of the invention can be extracted from the description and the drawing. The above mentioned features and those to be further described below in accordance with the invention can be utilized individually or collectively in arbitrary combination. The embodiments shown and described are not to be considered as exhaustive enumeration, rather have exemplary character only to illustrate the invention.

DESCRIPTION OF THE PREFERRED EMBODIMENT

Figure 1:
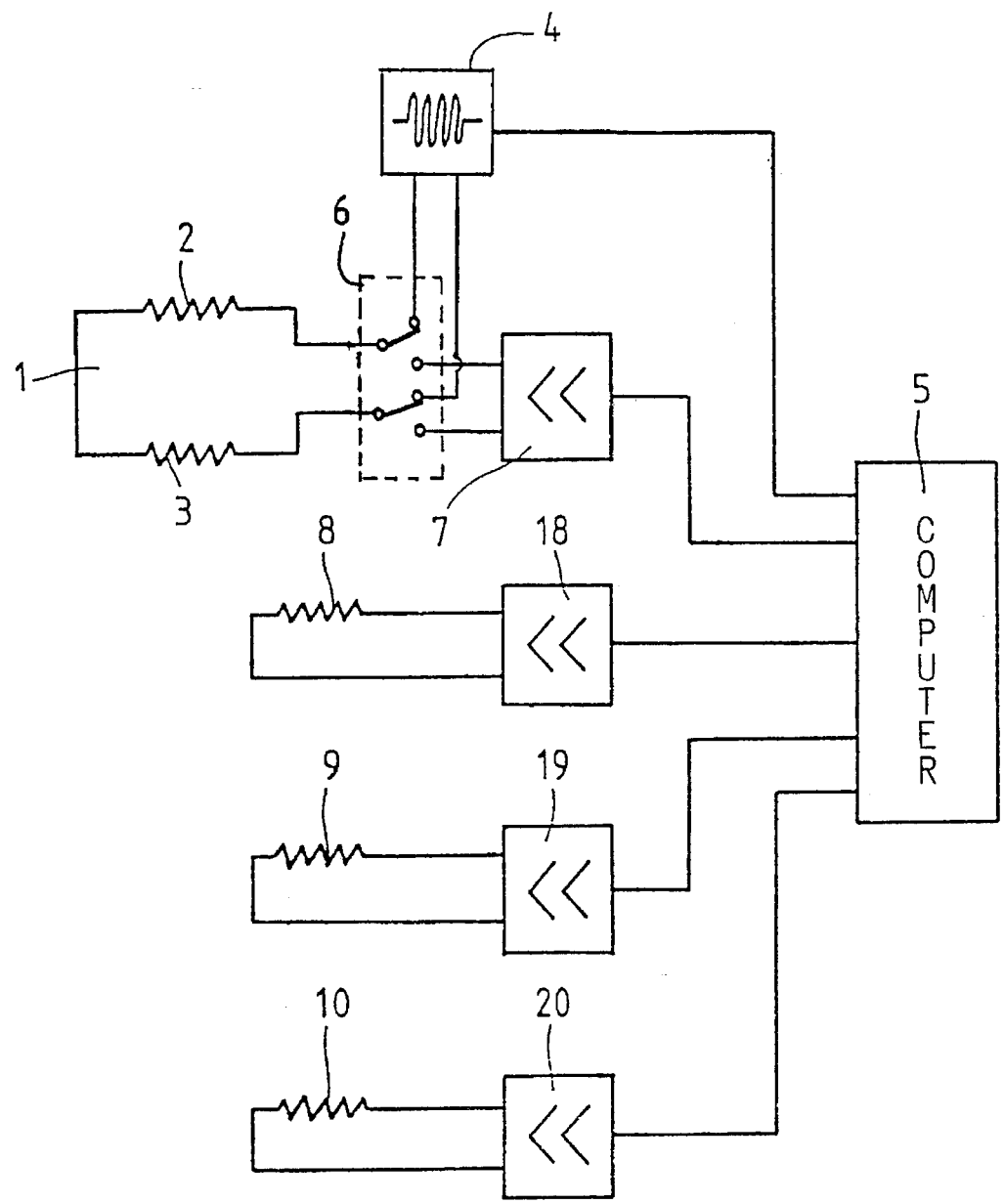
FIG. 1 shows a schematic block diagram for the circuiting of the measuring device in accordance with the invention.

The electrical circuit of the measuring device in accordance with the invention is schematically shown in FIG. 1. A detection coil 1 for the detection of NMR signals from the sensitivity region of the detection coil 1 in the earth comprises two partial coils 2 and 3 electrically connected in series. Low frequency excitation pulses from a low frequency (LF) computer 5 controlled generator 4, for coherent excitation of magnetic resonances, are introduced to the detection coil 1 by means of an electronic switch 6. Subsequently, the switch 6 is changed-over and the detection coil 1 can receive the excited NMR signals from the earth which are passed via amplifier 7 to the computer 5.

The two partial coils 2 and 3 are wound in opposite directions and both serve for excitation as well as for detection of the measured signal. For this reason both partial coils enhance each other for receiving the measuring signal. In contrast thereto a homogeneous interfering field induces oppositely directed voltages in the two partial coils 2 and 3 which largely compensate each other at the input of the amplifier 7.

Mutually orthogonally arranged compensation coils 8, 9, 10 are preferentially provided to additionally compensate spatially inhomogeneous interferences, the signals of which are highly amplified, in each case, by a dedicated amplifier 18, 19, 20 and passed-on to the computer. The gains for the signals from the individual compensation coils 8, 9, 10 are individually weighted in the computer 5 in such a fashion that, using the compensation coil configuration 8, 9, 10, the inhomogeneous interfering field vector signal is optimally reconstructed. This is then subtracted from the signal coming from the detection coil 1, which is highly amplified in the preamplifier 7, in order to also compensate for the interfering portions of spatially inhomogeneous interfering fields. In addition, the signals coming from the amplifiers 18, 19, 20 can be assigned a summed value in the computer 5 which can be assigned a gain in such a fashion that the difference between the signal from the detection coil 1 and the abovementioned sum signal is minimized in average over time.

Figure 2:
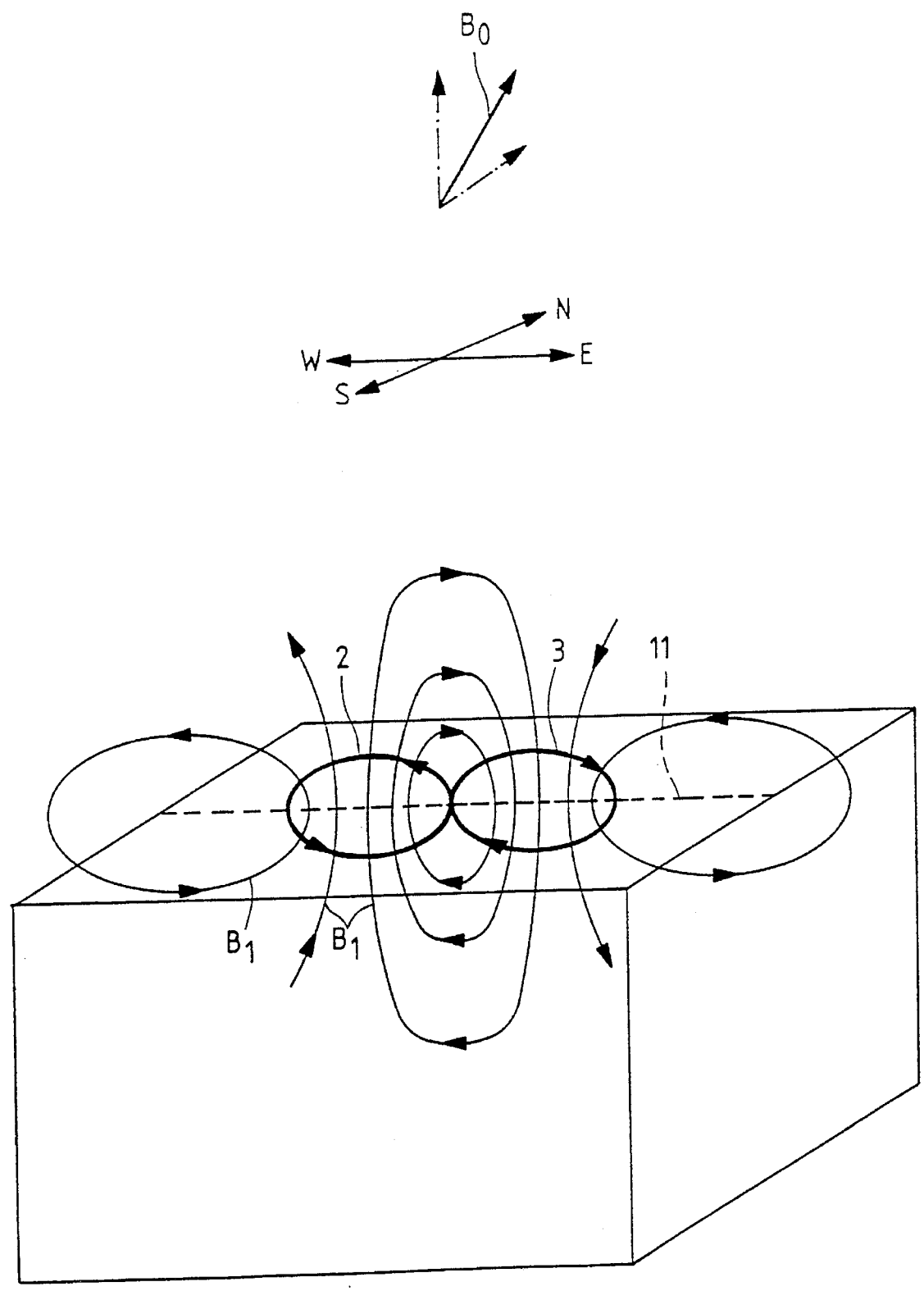
FIG. 2 shows a schematic spatial representation of a detection coil in accordance with the invention placed on a section of the earth's surface with the corresponding magnetic field distribution.

FIG. 2 illustrates a spatial section of a portion of the earth's surface which is intended to be measured with the assistance of the detection coil 1 comprising two partial coils 2, 3. Towards this end the magnetic field lines which are produced by the LF excitation pulse through the detection coil 1 are indicated. The natural magnetic field $B_0$ of the earth always overlaps the exciting magnetic field $B_1$. In order that the excitation field $B_1$ be perpendicular to the earth's field $B_0$ over as large a region as possible, in is advantageous for the detection coil 1 to be oriented in such a fashion that the lines of connection 11 between the middle points of their partial coils 2, 3 run largely in the west-east direction.

Figure 3:
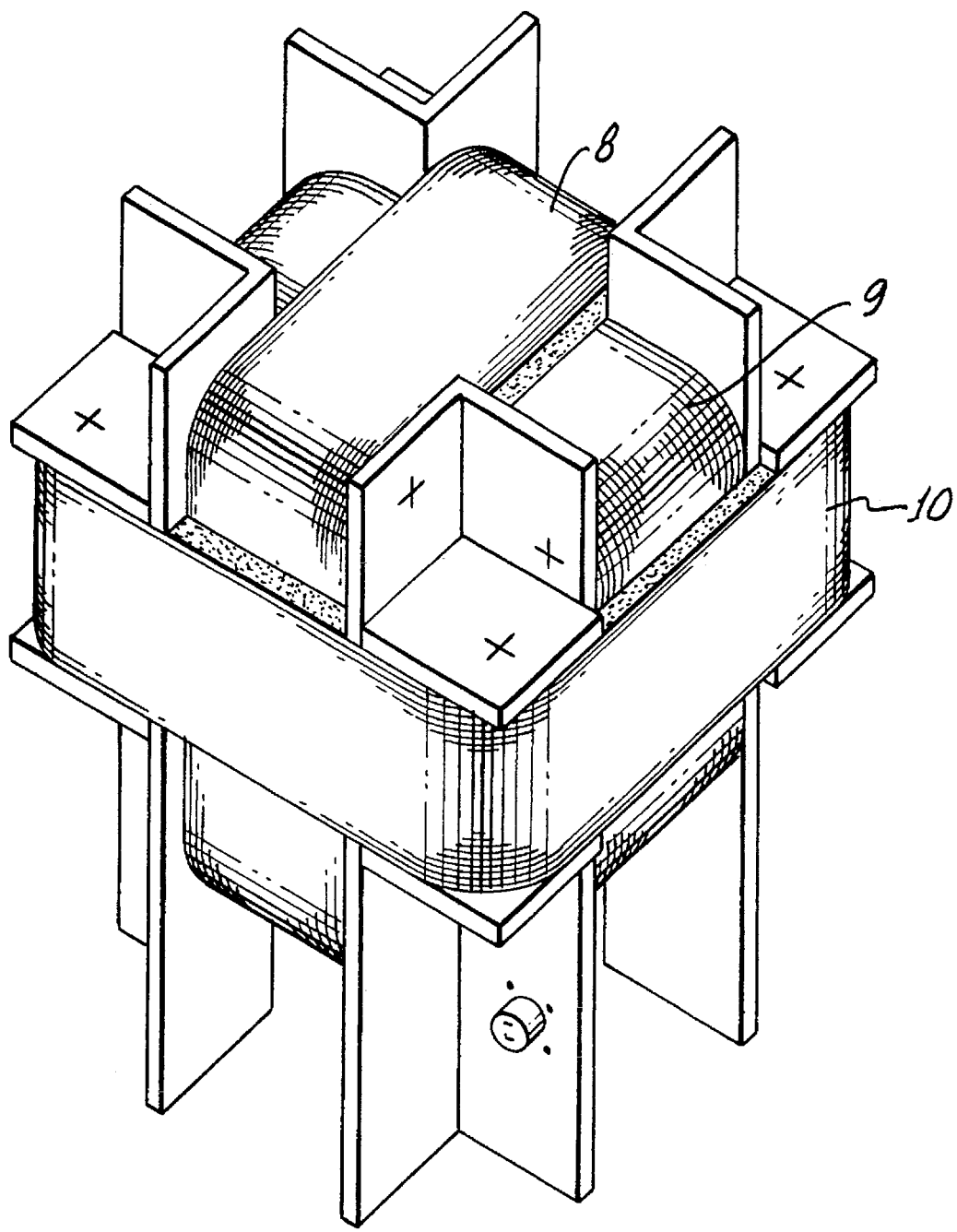
FIG. 3 shows an embodiment of an orthogonal compensation coil system in accordance with the invention.

FIG. 3 shows an embodiment of the compensation coils 8, 9, 10 in accordance with the invention which are mutually orthogonal and which can record, in a spatial Cartesian coordinate system, any arbitrary vector of a local magnetic interfering field with respect to magnitude, direction and orientation. Although at least one of the two partial coils 2 or 3 of the detection coil 1 has a typical diameter on the order of magnitude of 10 m to 100 m, the compensation coils 8, 9, 10 are relatively compact. In the example shown each of these coils has approximately 670 windings with an average length per winding of 0.5 m, e.g. the entire wire length per coil assumes a value of approximately 335 m. The individual compensation coils 8, 9, 10 each have an induction of L≈80 mH and an ohmic resistance R≈13 Ω. With a frequency of 2 kHz, the resistance due to the induction is approximately 1 kΩ. The individual compensation coils 8, 9, 10 typically each have between 500 and 1000 windings.

Figure 4:
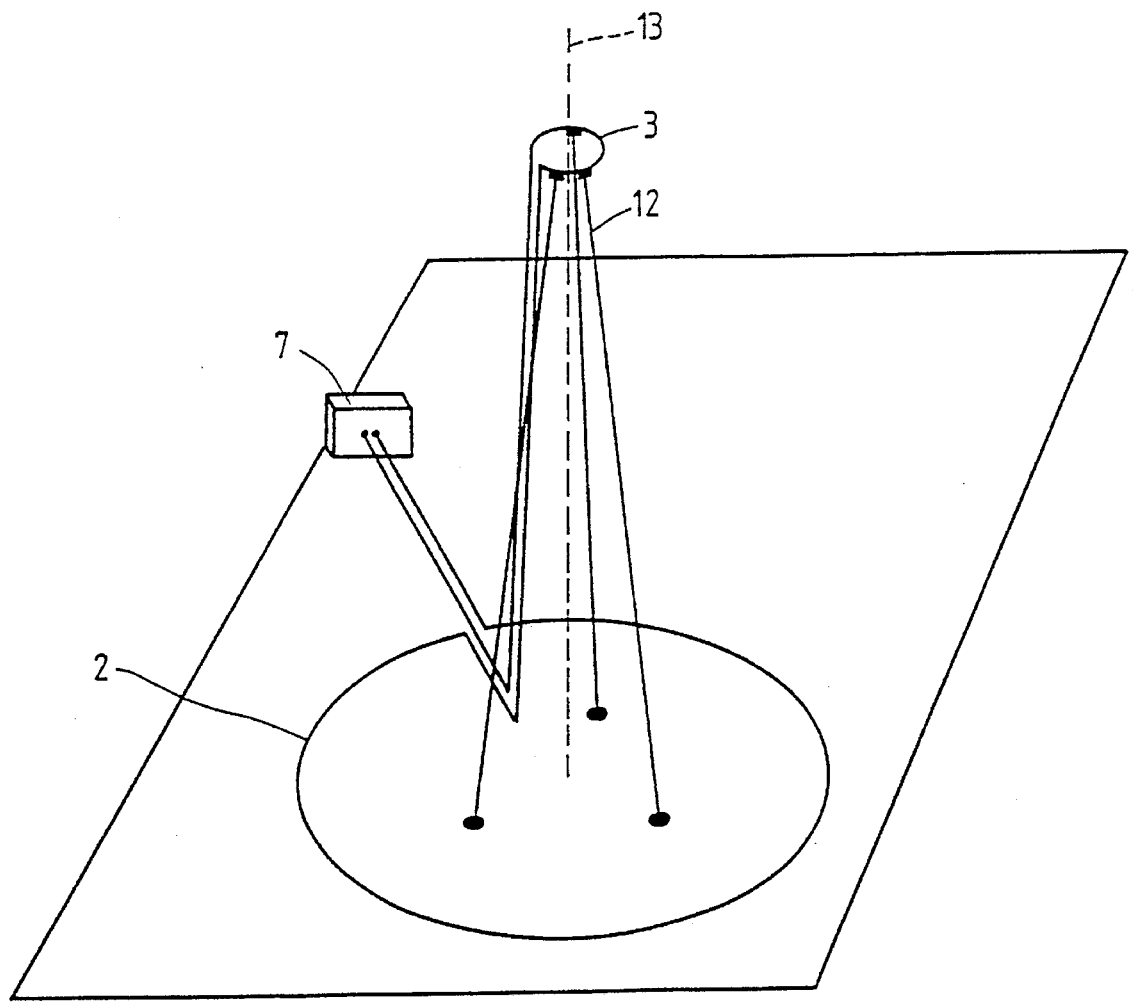
FIG. 4 shows an embodiment of the detection coil in accordance with the invention with a partial coil, spatially removed from the ground, for compensation of the far-field interferences.

FIG. 4 schematically shows a particularly preferred embodiment of the measuring device in accordance with the invention with which the partial coil 3 of the detection coil 1 is arranged at a spatial separation from the earth surface so that it receives largely no NMR signal from the structures in the ground lying there below, whereas the partial coil 2 largely accepts all signals from the nuclear resonance excitation of the ground region lying there below.

The partial coil 3 is mounted on a frame 12 in such a fashion that the connecting line 13 between the middle points of the two partial coils 2, 3 is perpendicular to the earth's surface.

The partial coil 3 which is arranged at a separation from the earth's surface, has a diameter which is relatively small compared to the partial coil 2 arranged there below on the earth's surface and a correspondingly higher winding number for its winding. Due to its compact construction, the partial coil 3 can be provided with a cooling device not represented in the drawing in order to reduce the ohmic resistance and the electrical noise within the partial coil 3. The partial coil 3 thereby solely serves to compensate homogeneous field interferences, whereas the compensation coils 8, 9, 10 serve to compensate the inhomogeneous portion of the distant field disturbances due to local conducting structures in the ground which, according to experience, are one to two orders of magnitude smaller than the homogeneous portion. It should be mentioned here that instead of the set of three compensation coils 8, 9, 10 which are shown, a plurality of sets of compensations coils can also be utilized.

Figure 5A:
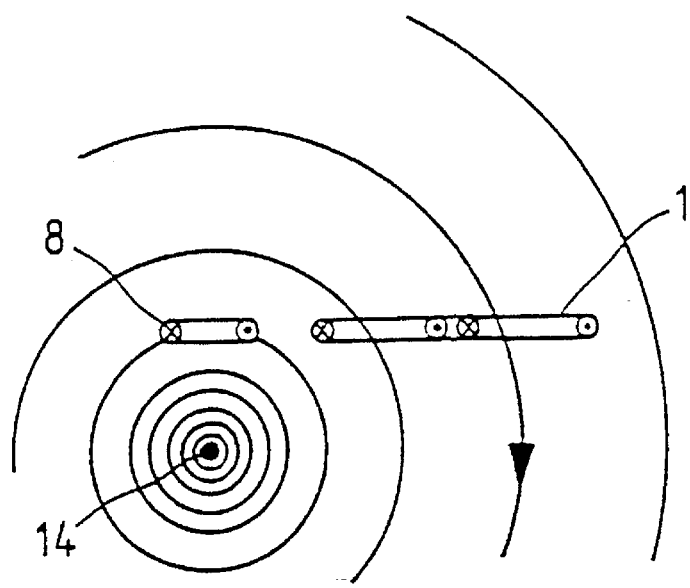
FIG. 5a shows a schematic representation of the position of the detection and compensation coils relative to a local inhomogeneous field interference, whereby no compensation is achieved.
Figure 5B:
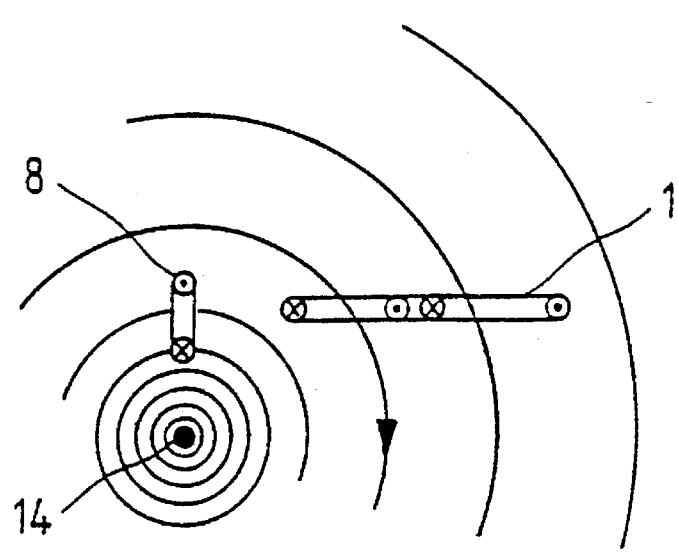
FIG. 5b shows a schematic representation of the position of the detection and compensation coils relative to a local inhomogeneous field interference, whereby optimal compensation effects are achieved.

Finally FIGS. 5a and 5b show possible alignments of a simple compensation coil 8 relative to a detection coil 1 and relative to an interference 14. In the case of FIG. 5a it is clear that no compensation of the local inhomogeneous disturbance can be effected by the compensation coil 1, since the magnetic field lines emanating from the center of the disturbance 14 lie in the plane of the compensation coil 8. In contrast thereto an optimum compensation is given by the relative configuration according to FIG. 5b, where the magnetic field lines of the interfering source 14 penetrate largely perpendicularly through the coil plane of the compensation coil 8.

We claim:

1. An apparatus for the detection of nuclear magnetic resonance (NMR) from the earth comprising: detection coil means for detecting an NMR induction voltage from excited nuclear spins precessing in the earth's magnetic field within a sensitivity region in the earth, the detection coil means comprising a first and a second partial coil having parallel coil axes, the partial coils being electrically connected to one another and wound in opposite directions; first amplifier means connected to the detection coil means for amplifying the NMR induction voltage; compensation coil means for detecting an inhomogeneous interference induction voltage from a spatially inhomogeneous interference field, the compensation coil means having three mutually orthogonal compensation coils to detect and reconstruct an arbitrarily oriented vector interference signal; and second amplifier means connected to the compensation coil means for amplifying the interference induction voltage, the second amplifier means having an adjustable gain.

2. The apparatus of claim 1, further comprising an additional compensation coil means comprising three additional compensation coils, wherein the additional compensation coil means and the compensation coil means are arranged at different locations.

3. The apparatus of claim 1, wherein the first and second partial coils have spatial positionings, winding numbers, cross-sectional areas, and material permeabilities selected to suppress a homogeneous interference induction voltage in the detection coil means from a spatially homogeneous magnetic interference field and to detect the NMR induction voltage.

4. The apparatus of claim 1, wherein at least the first partial coil is separated from the earth's surface to suppress a construction element interference induction voltage from construction elements located below the first partial coil.

5. The apparatus of claim 4, wherein the second partial coil is placed on the earth's surface and the first partial coil is smaller than the second partial coil but has a higher winding number.

6. The apparatus of claim 5, further comprising cooling system means connected to at least one of the first and the second partial coils for cooling same.

7. The apparatus of claim 4, wherein the first partial coil has a coil plane generally parallel to the earth's surface.

8. The apparatus of claim 7, wherein the first partial coil has a first middle point and the second partial coil has a second middle point and a line connecting the first and the second middle points is generally perpendicular to the earth's surface.

9. Method for detecting NMR from the earth comprising the steps of:

a) coherently exciting nuclear spins from a sensitivity region of a detection coil to precess in the earth's magnetic field;

b) detecting an NMR induction signal induced in the detection coil by the precessing nuclear spins;

c) detecting, using three mutually orthogonal compensation coil, interference induction signals from an interference field;

d) combining the NMR and interference signals into a combined signal; and e) repeating steps a) through d) to accumulate the combined signal over a plurality of excitations.

10. The method of claim 9, further comprising the step of: c1) amplifying the interference induction signals to minimize the combined signal.

11. The method of claim 10, further comprising the step of: a2) maximizing, prior to step a), the interference signals from the compensation coils by adjusted placement of the compensation coils in the vicinity of the detection coil.

12. The method of claim 11, further comprising the step of:

a3) maximizing, prior to step a), the interference signals by adjusting spatial orientations of the compensation coils.

13. The method of claim 12, wherein, in step d), the combined signal is formed by subtracting an interference signal of the one of the three compensation coils from the NMR signal, and further comprising the steps of:

a4) orienting, following steps a2) and a3) and, prior to steps a), the one compensation coil to detect the interference signals determined by the three compensation coils;

d2) rectifying the combined signal into a rectified signal; and c3) varying, an amplification gain of the interference signal of the one compensation coil to minimize a time integral over the rectified signal.

14. The method of claim 11, wherein, in step d), the combined signal is formed by subtracting the interference signals from NMR signal and, in step c1), signal from each of the three compensation coils is amplified and further comprising the steps of:

d3) rectifying the combined signal into a rectified signal; and c4) varying an amplification gain of each signal from each of the plurality of compensation coils to minimize a time integral over the rectified signal.

15. The method of claim 11, wherein, in step d), the combined signal is formed by subtracting the interference signal from the NMR signal and, in step c1), a signal from each of the plurality of compensation coils is individually amplified and further comprising the steps of:

d4) rectifying the combined signal into a rectified signal;

a5) maximizing, prior to step a) and following step a2), the interference signals by adjusting individual gains of individual amplifiers of the compensation coils; and c5) varying following step a5), a common amplification of the compensation coils to minimize a time integral over the rectified signal.

16. The method of claim 9 further comprising the steps of:

d5) fitting, following each excitation in step a), a spectrum having a plurality of spectral lines to the combined signal; and d6) subtracting the spectrum from the combined signal.

17. The method of claim 16, wherein the fitting of step d5) is done using one of a linear projection and a maximum-entropy method.

18. The method of claim 9, further comprising the steps of: f) digitizing the accumulated combined signal of step e); and g) Fourier transforming the digitized signal of step f) to obtain a frequency spectrum of the NMR signal of an investigated region of the earth.

* * * * *